US012562699B2

(12) United States Patent
Saikrishna et al.

(10) Patent No.: US 12,562,699 B2
(45) Date of Patent: Feb. 24, 2026

(54) APPARATUS AND METHOD FOR CONTROLLING NON-LINEAR EFFECT OF POWER AMPLIFIER

(71) Applicant: SAMSUNG ELECTRONICS CO., LTD., Suwon-si (KR)

(72) Inventors: Pedamalli Saikrishna, Karnataka (IN); Ankur Goyal, Karnataka (IN); Ashok Kumar Reddy Chavva, Karnataka (IN); Ashwini Kumar, Karnataka (IN); Suhwook Kim, Suwon-si (KR); Sangho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 569 days.

(21) Appl. No.: 17/976,514

(22) Filed: Oct. 28, 2022

(65) Prior Publication Data

US 2023/0138959 A1    May 4, 2023

(30) Foreign Application Priority Data

Oct. 28, 2021    (IN) ............................. 202141049431
Oct. 14, 2022    (IN) ............................. 202141049431

(51) Int. Cl.
| | |
|---|---|
| *H03F 3/26* | (2006.01) |
| *G06F 18/214* | (2023.01) |
| *G06K 9/62* | (2022.01) |
| *G06N 3/04* | (2023.01) |
| *G06N 3/045* | (2023.01) |

(52) U.S. Cl.
CPC ............. *H03F 3/26* (2013.01); *G06F 18/214* (2023.01); *G06N 3/045* (2023.01); *H03F 2201/3227* (2013.01)

(58) Field of Classification Search
CPC ...... H03F 3/26; H03F 2201/3227; H03F 3/19; H03F 2200/451; H03F 1/3241;
(Continued)

(56) References Cited

U.S. PATENT DOCUMENTS

| | | | |
|---|---|---|---|
| 10,763,904 B2 | 9/2020 | Megretski et al. | |
| 10,985,705 B2 | 4/2021 | Andrey et al. | |

(Continued)

FOREIGN PATENT DOCUMENTS

| | | |
|---|---|---|
| CN | 112640299 | 4/2021 |
| KR | 10-1679230 | 11/2016 |

(Continued)

OTHER PUBLICATIONS

Morgan et al., "A Generalized Memory Polynomial Model for Digital Predistortion of RF Power Amplifiers", IEEE Transactions on Signal Processing, vol. 54, No. 10, Oct. 2006, published Sep. 18, 2006, pp. 3852-3860.

(Continued)

*Primary Examiner* — Hieu P Nguyen
(74) *Attorney, Agent, or Firm* — Nixon & Vanderhye, P.C.

(57) ABSTRACT

Embodiments herein disclose a method for controlling a non-linear effect of a power amplifier by an apparatus. The method includes acquiring an input data of the power amplifier of the apparatus and an output data of the power amplifier. Further, the method includes determining an inverse function using a neural network. The inverse function maps normalized output data of the PA to the input data of the PA, where the neural network comprises at least one sub-network for at least one memory tap from a plurality of memory taps in the neural network. Further, the method includes modifying the input data based on the determined inverse function value by dynamically changing a usage of the at least one memory tap from the plurality of memory taps. Further, the method includes compensating the non-linear effect in the output data of the power amplifier.

14 Claims, 19 Drawing Sheets

500

(58) Field of Classification Search
     CPC ...... H03F 1/3247; H03F 1/3258; H03F 3/245;
                G06F 18/214; G06N 3/045; G06N 3/048;
                                                  G06N 3/08
     USPC ........................................ 330/149, 289, 136
     See application file for complete search history.

(56)                   References Cited

U.S. PATENT DOCUMENTS

| | | | |
|---|---|---|---|
| 11,277,103 B2 | 3/2022 | Yan | |
| 2007/0133713 A1 | 6/2007 | Palipi | |
| 2011/0221527 A1 | 9/2011 | Woo et al. | |
| 2022/0385317 A1 | 12/2022 | Jung et al. | |
| 2024/0119264 A1* | 4/2024 | Vu | ........................ G06N 3/048 |

FOREIGN PATENT DOCUMENTS

| | | |
|---|---|---|
| KR | 10-2021-0050961 | 5/2021 |
| KR | 10-2021-0097698 | 8/2021 |
| KR | 10-2550079 | 7/2023 |

OTHER PUBLICATIONS

Tanio et al., "Efficient Digital Predistortion Using Sparse Neural Network", IEEE Access, vol. 8, Jun. 26, 2020, pp. 117841-117852.

Sun et al., "Behavioral Modeling and Linearization of Wideband RF Power Amplifiers Using BILSTM Networks for 5G Wireless Systems", IEEE Transactions on Vehicular Technology, vol. 68, No. 11, Nov. 2019, published Jun. 28, 2019, pp. 10348-10356.

Hu et al., "Convolutional Neural Network for Behavioral Modeling and Predistortion of Wideband Power Amplifiers", IEEE Transactions on Neural Networks and Learning Systems, vol. 33, No. 9, Aug. 2022, published Feb. 10, 2021, pp. 3923-3937.

Eun et al., "A new Volterra predistorter based on the indirect learning architecture", IEEE Transactions on Signal Processing, vol. 45, No. 1, Jan. 1997, pp. 223-227.

Rawat et al., "A mutual distortion and impairment compensator for wideband direct-conversion transmitters using neural networks", IEEE Transactions on Broadcasting, vol. 58, No. 2, Jun. 2012, published Apr. 5, 2012, pp. 168-177.

Wang et al., "Augmented real-valued time-delay neural network for compensation of distortions and impairments in wireless transmitters", IEEE Transactions on Neural Networks and Learning Systems, vol. 30, No. 1, Jan. 2019, published Jun. 12, 2018, pp. 242-254.

Search Report and Written Opinion dated Feb. 2, 2023 issued in International Patent Application No. PCT/KR2022/016243.

Indian Office Action issued Jul. 28, 2023 in corresponding Indian Patent Application No. 202141021585.

* cited by examiner

S200

300

302

X

PA

Y $Y = f(P_i) * X$ $$Y_c = G * X$$

FIG. 6
500
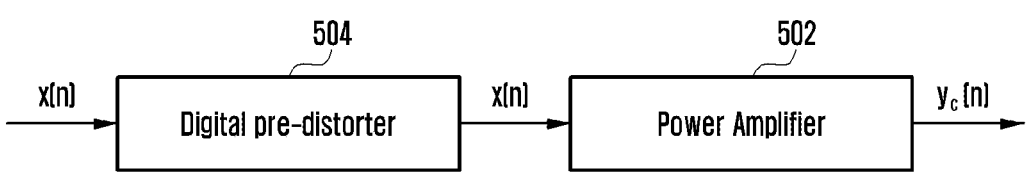
504
502
x[n]
    Digital pre-distorter
x[n]
    Power Amplifier
$y_c$ [n]

Figure 12:
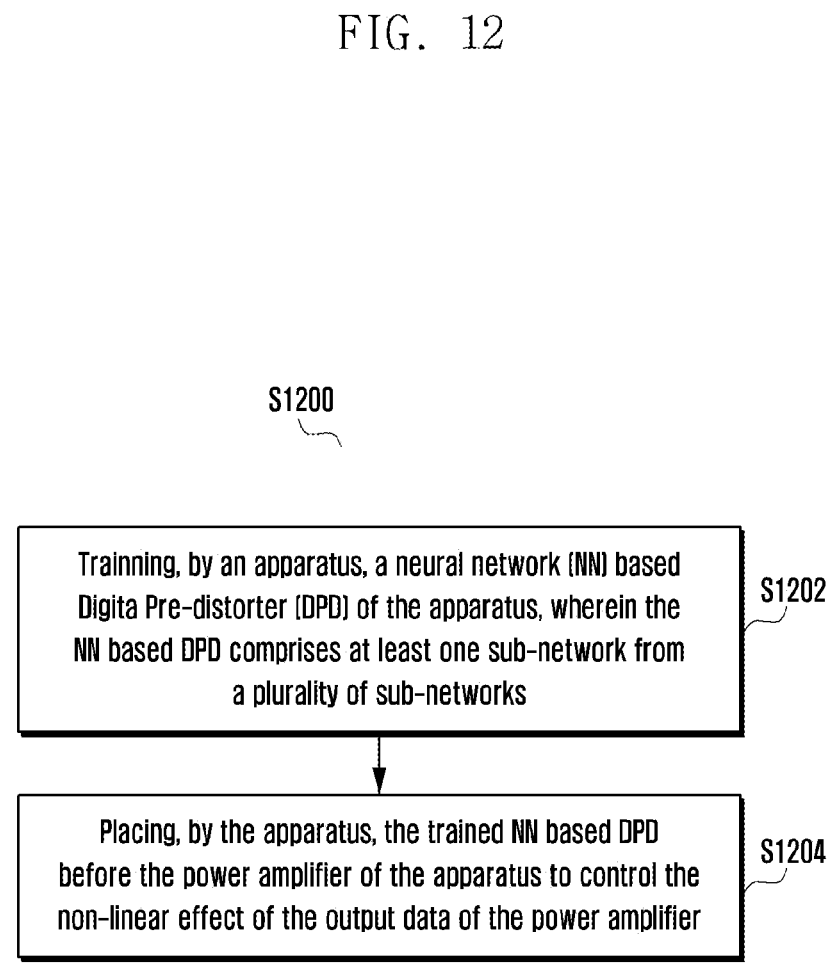

Trainning, by an apparatus, a neural network (NN) based Digita Pre-distorter (DPD) of the apparatus, wherein the NN based DPD comprises at least one sub-network from a plurality of sub-networks — S1202

Placing, by the apparatus, the trained NN based DPD before the power amplifier of the apparatus to control the non-linear effect of the output data of the power amplifier — S1204

FIG. 13

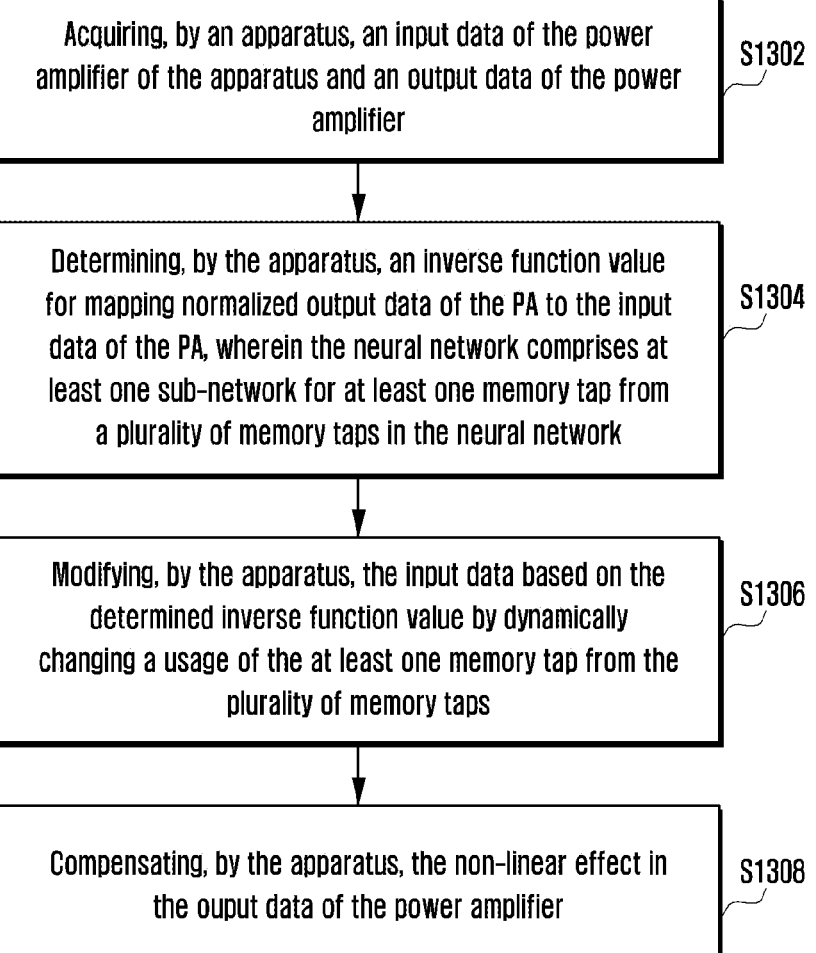

S1300

Acquiring, by an apparatus, an input data of the power amplifier of the apparatus and an output data of the power amplifier
S1302

Determining, by the apparatus, an inverse function value for mapping normalized output data of the PA to the input data of the PA, wherein the neural network comprises at least one sub-network for at least one memory tap from a plurality of memory taps in the neural network
S1304

Modifying, by the apparatus, the input data based on the determined inverse function value by dynamically changing a usage of the at least one memory tap from the plurality of memory taps
S1306

Compensating, by the apparatus, the non-linear effect in the ouput data of the power amplifier
S1308

1

APPARATUS AND METHOD FOR CONTROLLING NON-LINEAR EFFECT OF POWER AMPLIFIER

CROSS-REFERENCE TO RELATED APPLICATIONS

This application is based on and claims priority under 35 U.S.C. § 119 to Indian Provisional Patent Application No. 202141049431, filed on Oct. 28, 2021, in the Indian Patent Office, and to Indian Non-Provisional Patent Application No. 202141049431, filed on Oct. 14, 2022, in the Indian Patent Office, the disclosures of which are incorporated by reference herein in their entireties.

BACKGROUND

Field

The disclosure relates to a method and an apparatus for compensating power amplifier Non-linearities using a neural network (e.g., memory polynomial inspired neural network or the like).

Description of Related Art

Wireless communication systems or networks use a power amplifier to boost a baseband signal before transmitting the baseband signal. This helps the baseband signal reach a receiver in spite of attenuation experienced over a channel. The power amplifiers (PA) exhibit non-linear behaviour when operated at the higher power. This affects signal quality and also causes spectrum regrowth. A Digital Pre-distorter (DPD) is used to compensate for the nonlinear behaviour of the PA. The DPD tries to modify the baseband signal such that the modified signal when passed through PA results in linear amplification of the baseband signal. The DPD achieves this by learning the inverse of the PA distortion and applying it to the input signal FIG. 1 and FIG. 2 are example graphs (S100 and S200) illustrating a typical amplitude-amplitude (AM-AM) and AM-PM characteristics of the PA. The PAs, when operated at the higher power introduces non-linearity with respect to gain, which can be observed from the AM-AM characteristics graph. The PAs also introduce some phase shift which can be observed from the AM-PM characteristics graph.

FIG. 3 and FIG. 4 illustrate a scenario (300) of the power amplifier (PA) (302) and a positioning of the DPD (304), according to the prior arts. In the conventional methods and systems, the DPD (304) is used to compensate for a non-linear behaviour exhibited by the PA (302) when the PA (302) is operated in a high power region. The DPD (304) achieves this by learning the inverse of the PA distortion and applying it to the input signal. That is the DPD (304) tries to modify the baseband signal such that a modified signal when passed through the PA results in linear amplification of the base band signal. As shown in FIG. 1 and FIG. 2, the output of the PA is represented in equations (1 and 2).

$$Y=f(P_i)^*X \qquad (1)$$

$$Y_c=G^*X \qquad (2)$$

The problem of the non-linearity compensation for the PA (302) is well explored and there are many mathematical models and neural networks (NN) based architectures that try to model the inverse of the non-linearity and place that before the PA (302), commonly known as DPD. There are wide range of NN architectures explored for the DPD in the existing systems and methods using fully connected, convolutional, BI-LSTM and residual network based architectures.

But the NN based architectures in the existing systems and methods try to model the DPD using the current and past samples (PA output) together (with same importance) and try to estimate the input of the PA. With this approach, there is no straightforward extension for the case when apriori information about the extent of impact of the previous sample is available. Also, the models in the existing systems and methods are trained end to end. So, if an apparatus (300) needs to train them for minor changes online, the system/apparatus (300) needs to train the complete network as a whole.

SUMMARY

Embodiments of the disclosure provide a method and an apparatus for compensating a power amplifier non-linearities using a neural network (NN) (e.g., memory polynomial inspired neural network or the like). The method has separate sub-networks for each of a memory tap. This helps in having output nodes of the sub network flexible to chronology of the samples. In the method, separate sub-networks for memory taps provides with a lot of flexibility with respect to number of memory taps to be used. The NN has a fixed and trainable part during online training. This adapts to the changes in real time with minimal training overhead.

According to an example method, an inference cost along with a training cost will reduce drastically based on the number of past samples used. The method takes very short time to adapt to the changes compared to machine learning (ML) techniques and has better performance than the conventional approaches. Having separate sub-networks for each memory tap, the disclosed architecture can provide importance to the samples based on chronology and with fixed sub-network for some past samples, the method can further reduce the training and inference complexity.

Accordingly, various example embodiments of the disclosure provide a method for controlling a non-linear effect of a power amplifier. The method includes: training, by an apparatus, a neural network (NN) based Digital Pre-distorter (DPD) of the apparatus, wherein the NN based DPD comprises at least one sub-network from a plurality of sub-networks; placing, by the apparatus, the trained NN based DPD before the power amplifier of the apparatus to control the non-linear effect of the output data of the power amplifier.

According to an example embodiment, the method includes transmitting, by the apparatus, a linearly amplified signal comprising the non-linear effect of the output data of the power amplifier.

According to an example embodiment, the method includes: continuously monitoring, by the apparatus, at least one of an error vector magnitude (EVM) parameter associated with the linearly amplified signal and an adjacent channel leakage ratio (ACLR) parameter associated with the linearly amplified signal; determining, by the apparatus, whether at least one of the EVM parameter and the ACLR parameter meets a specified threshold; performing, by the apparatus, one of: retaining at least one NN parameter in the trained NN based DPD in response determining that at least one of the EVM parameter and the ACLR parameter meets the specified threshold, and retraining the trained NN based DPD to modify at least one NN parameter in the trained NN based DPD in response determining at least one of the EVM parameter and the ACLR parameter does not meet the predefined threshold.

According to an example embodiment, a number of an output node of the sub-network corresponds to a current input data to at least one previous input data and at least one previous output data.

According to an example embodiment, the NN based DPD is trained by training a fully connected part of the network, wherein the fully connected part captures a non-linear parameter, wherein the non-linear parameter comprises a memory information and temperature information, and training a partially connected part of the plurality of sub-networks based on at least one previous input data and at least one previous output data, wherein the fully connected part and the partially connected part are trained separately, wherein the fully connected part is trained in real time. For example, at first (initial), the whole network (partially connected and fully connected parts together) is trained in a single. If there are further non linearities, the apparatus can train only the fully connected part on the fly while retaining the previous parameters for the partially connected part. The partially connected part of the network also makes use of the current sample and not just the past samples According to an example embodiment, the NN based DPD is trained by all sub-networks corresponding to at least one previous input data and at least one previous output data with at least one sub-network parameter, wherein the at least one sub-network parameter comprises an output node, weight and biases.

Accordingly, various example embodiments of the disclosure provide a method for controlling a non-linear effect of a power amplifier. The method includes: acquiring, by an apparatus, an input data of the power amplifier of the apparatus and an output data of the power amplifier; determining, by the apparatus, an inverse function using a neural network, wherein the inverse function maps normalized output data of the PA to the input data of the PA, wherein the neural network comprises at least one sub-network for at least one memory tap from a plurality of memory taps in the neural network; modifying, by the apparatus, the input data based on the determined inverse function value by dynamically changing a usage of the at least one memory tap from the plurality of memory taps; and compensating, by the apparatus, the non-linear effect in the output data of the power amplifier.

According to an example embodiment, the inverse function value is learned by minimizing and/or reducing an error between a current input of the power amplifier and an estimated input of the power amplifier from a normalized power amplifier output over a period of time.

Accordingly, various example embodiments of the disclosure provide an apparatus for controlling a non-linear effect of a power amplifier. The apparatus includes: a NN based DPD having at least one sub-network from a plurality of sub-networks, wherein the trained NN based DPD is placed before the power amplifier to control the non-linear effect of the output data of the power amplifier.

Accordingly, various example embodiments of the disclosure provide an apparatus for controlling a non-linear effect of a power amplifier. The apparatus includes: a NN based DPD having at least one sub-network from a plurality of sub-networks. The NN based DPD is configured to acquire an input data of the power amplifier of the apparatus and an output data of the power amplifier. The NN based DPD is configured to determine an inverse function value, wherein the inverse function maps normalized output data of the PA to the input data of the PA wherein the NN based DPD comprises at least one sub-network for at least one memory tap from a plurality of memory taps in the neural network. The NN based DPD is configured to modify the input data based on the determined inverse function value by dynamically changing a usage of the at least one memory tap from the plurality of memory taps. The NN based DPD is configured to compensate the non-linear effect in the output data of the power amplifier These and other aspects of the various example embodiments herein will be better appreciated and understood when considered in conjunction with the following description and the accompanying drawings. It should be understood, however, that the following descriptions, while indicating various example embodiments and numerous specific details thereof, are given by way of illustration and not of limitation. Many changes and modifications may be made within the scope of the embodiments herein without departing from the scope thereof, and the embodiments herein include all such modifications.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 6 is a diagram illustrating an example scenario of learned function using ILA placed before PA to compensate for non-linearities, according to the various embodiments;

FIGS. 11A, 11B, 11C, 11D, 11E, 11F, 12 and FIG. 13 are diagrams and flowcharts illustrating various example methods for controlling the non-linear effect of the power amplifier, according to various embodiments.

DETAILED DESCRIPTION

Figure 1:
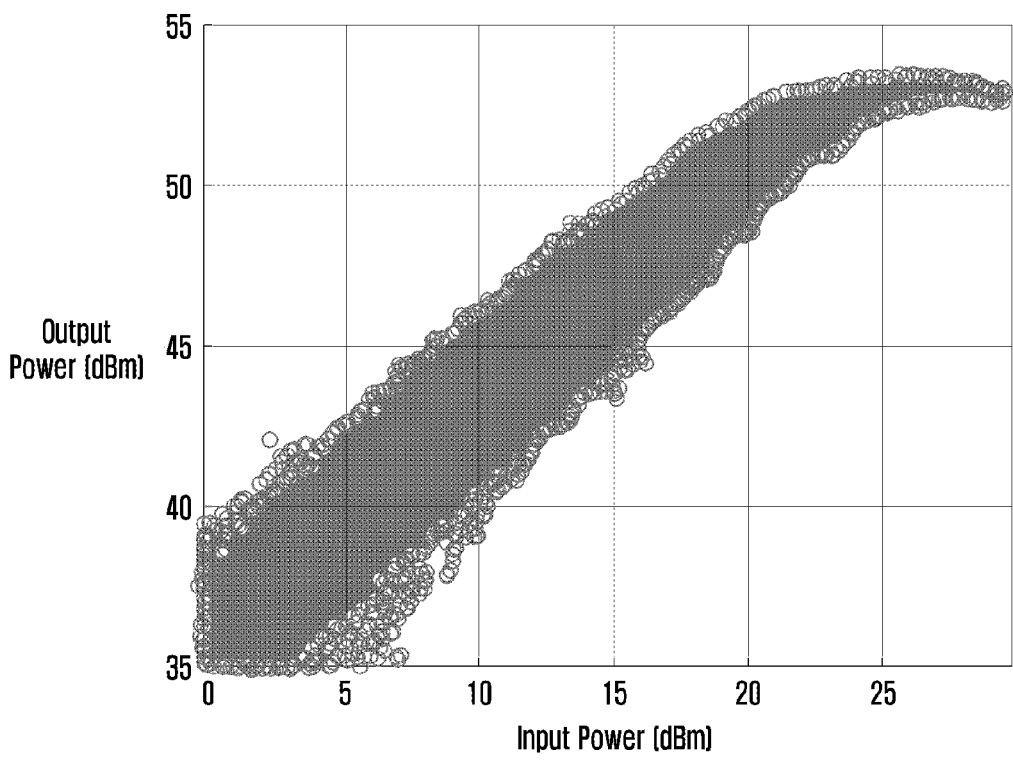
FIG. 1 and FIG. 2 are example graphs illustrating a typical amplitude-amplitude (AM-AM) and AM-PM characteristics of a Power Amplifier (PA) according to the prior art.
Figure 2:
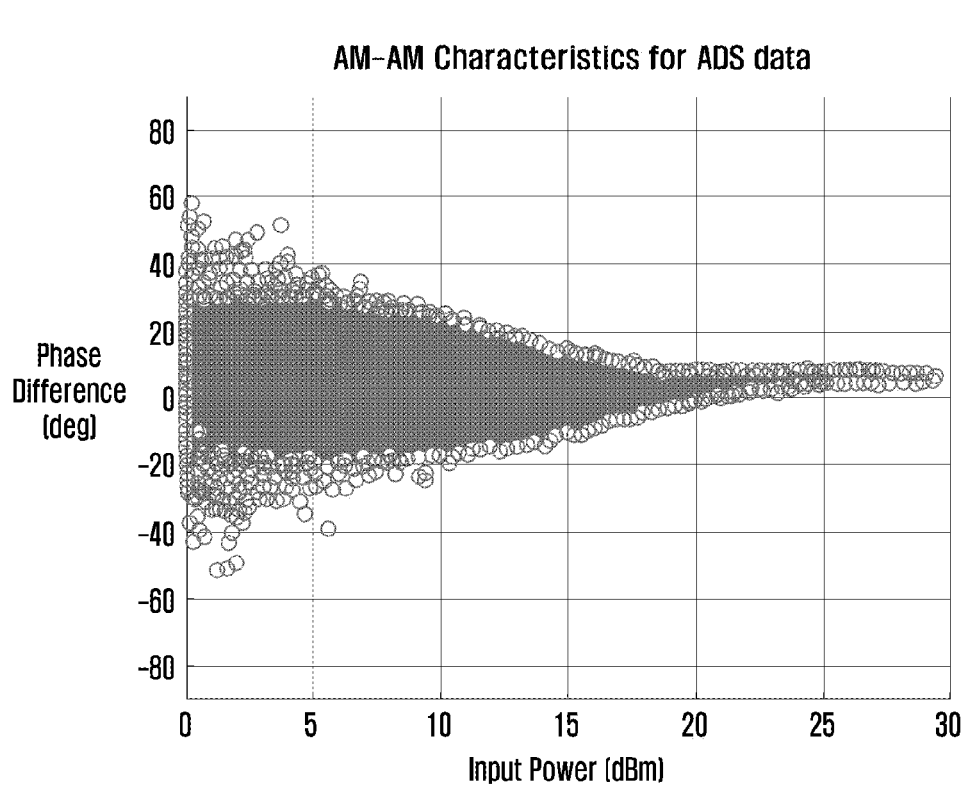
Figure 3:
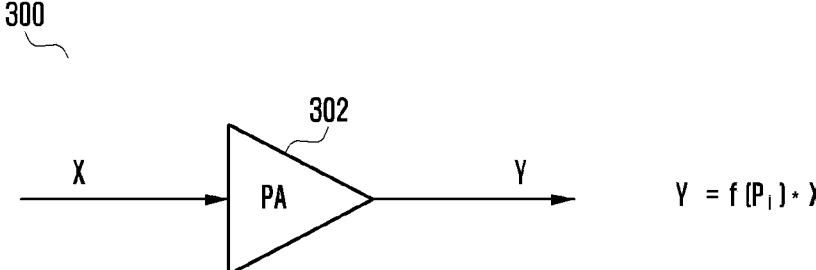
FIG. 3 and FIG. 4 are diagrams illustrating a scenario of Power Amplifier (PA) and a positioning of DPD, according to the prior art.
Figure 4:
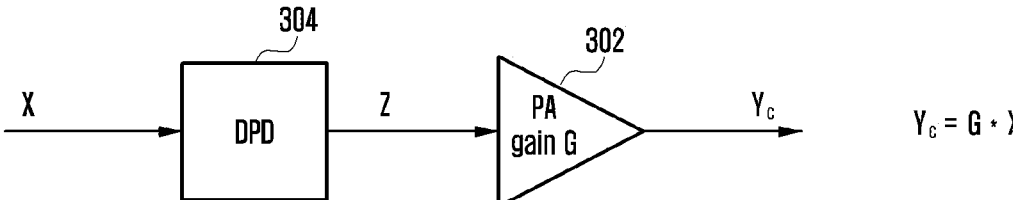

The various example embodiments herein and the various features and advantageous details thereof are explained more fully with reference to the non-limiting embodiments that are illustrated in the accompanying drawings and described in the following description. Descriptions of well-known components and processing techniques may be omitted so as to not unnecessarily obscure the description of the various example embodiments herein. The various embodiments described herein are not necessarily mutually exclusive, as various embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

Embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hard-wired circuits and the like, and may optionally be driven by firmware and software. The circuits may, for example, be embodied in one or more semiconductor chips, or on substrate supports such as printed circuit boards and the like. The circuits of a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Accordingly, various example embodiments provide a method for controlling a non-linear effect of a power amplifier. The method includes acquiring, by an apparatus, an input data of the power amplifier of the apparatus and an output data of the power amplifier. Further, the method includes determining, by the apparatus, an inverse function using a neural network, wherein the inverse function maps normalized output data of the PA to the input data of the PA, wherein the neural network comprises at least one sub-network for at least one memory tap from a plurality of memory taps in the neural network. Further, the method includes modifying, by the apparatus, the input data based on the determined inverse function value by dynamically changing a usage of the at least one memory tap from the plurality of memory taps. Further, the method includes compensating, by the apparatus, the non-linear effect in the output data of the power amplifier.

There are various NN based DPD architectures in the existing method but none of them have use separate sub-networks for separate memory taps and training only a part of the network online while using parameters trained offline for the majority of the network. The disclosed method has separate sub networks for each of the memory tap. This helps in having output nodes of the sub network flexible to chronology of the samples. In the disclosed method, the separate subnetworks for memory taps provides with a lot of flexibility with respect to number of memory taps to be used.

The disclosed NN has a fixed and trainable part during online training. This adapts to the changes in real time with minimal training overhead.

In the disclosed method, the inference cost along with the training cost will reduce drastically based on the number of past samples used. The disclosed method takes very short time to adapt to the changes compared to ML techniques and has better performance than the conventional approaches. Having separate sub-networks for each memory tap, the disclosed architecture can provide importance to the samples based on chronology and with fixed sub-network for some past samples, the method can further reduce the training and inference complexity.

Referring now to the drawings and more particularly to FIGS. 5 through 14, where similar reference characters denote corresponding features consistently throughout the figures, there are shown various example embodiments.

Figure 5:
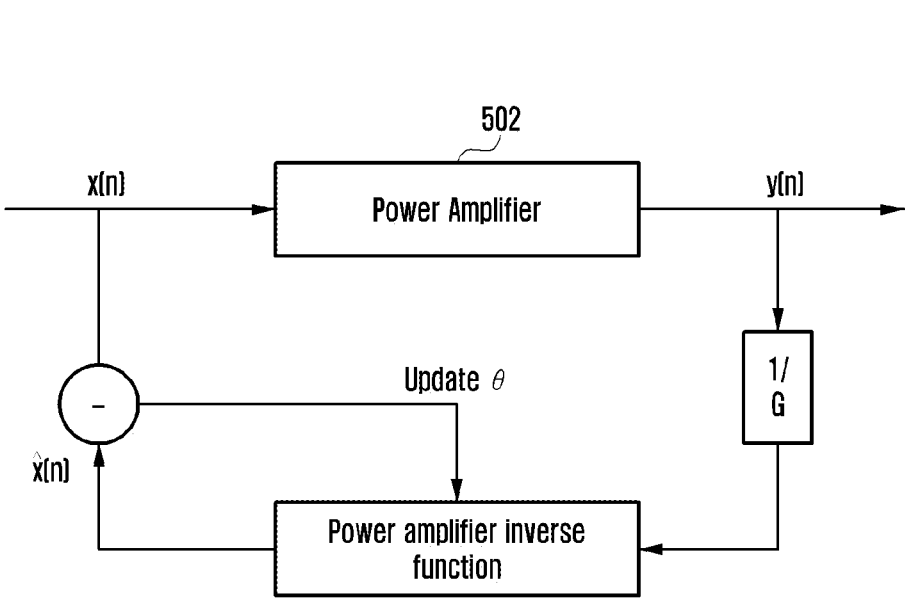
FIG. 5 is diagram illustrating an example scenario of indirect learning architecture, in which an apparatus controls the non-linear effect of the power amplifier, according to various embodiments.

FIG. 5 is a diagram illustrating an example scenario of indirect learning architecture, in which an apparatus (500) controls the non-linear effect of the power amplifier (502), according to various embodiments.

As shown in FIG. 5, the apparatus (500) controls the non-linear effect of the power amplifier (502). The apparatus (500) includes a NN based Digital Pre-distorter (DPD) (504) (see, e.g., FIG. 6). The NN based DPD (504) comprises at least one sub-network from a plurality of sub-networks (explained in greater detail below with reference to FIG. 7 to FIG. 10). The trained NN based DPD (504) is placed before the power amplifier (502) to control the non-linear effect of the output data of the power amplifier (502). Further, the power amplifier (502) transmits a linearly amplified signal comprising the non-linear effect of the output data of the power amplifier (502).

In an embodiment, the trained NN based DPD (504) continuously monitors at least one of an error vector magnitude (EVM) parameter associated with the linearly amplified signal and an adjacent channel leakage ratio (ACLR) parameter associated with the linearly amplified signal. Further, the trained NN based DPD (504) determines whether at least one of the EVM parameter and the ACLR parameter meets a predefined threshold. In an embodiment, in response determining that at least one of the EVM parameter and the ACLR parameter meets the predefined threshold, the trained NN based DPD (504) retain at least one NN parameter in the trained NN based DPD. In an embodiment, the trained NN based DPD (504) retrain the trained NN based DPD to modify at least one NN parameter in the trained NN based DPD in response determining at least one of the EVM parameter and the ACLR parameter does not meet the predefined threshold.

In an example, for input x(n), let the output of PA (502), y(n) is given by—

$$y(n)=f_{PA}[x(n)]$$

Then there is a need to find the function $f_{dpd}$ such that—

$$y_c(n)=f_{PA}[f_{DPD}[x(n)]]=G^*x(n)$$

Different ways are proposed in the existing methods to learn the inverse function of the PA non linearity, which then acts as the DPD (504). Here the disclosed method makes use of the indirect learning architecture (ILA) principal to achieve this.

Here, the apparatus (500) tries to learn the PA inverse function, which tries to estimate the PA input given its output normalized with gain. This inverse function is learned by minimizing/reducing the error between the actual input of the PA (502) and the estimated PA input using the learned function from the normalized PA output. Simply put, this inverse function learns to provide x(n) given y(n)/G.

FIG. 6 is diagram illustrating an example scenario of learned function using ILA placed before PA to compensate for non-linearities, according to the embodiments as disclosed herein. For input x(n), the apparatus want the output of PA to be G*x(n). So, the input x(n) is first passed through the learned inverse function (DPD) 504, which identifies the input to be fed to PA z(n) such that the PA output results in linear amplification of the actual input, G*x(n).

Figure 7:
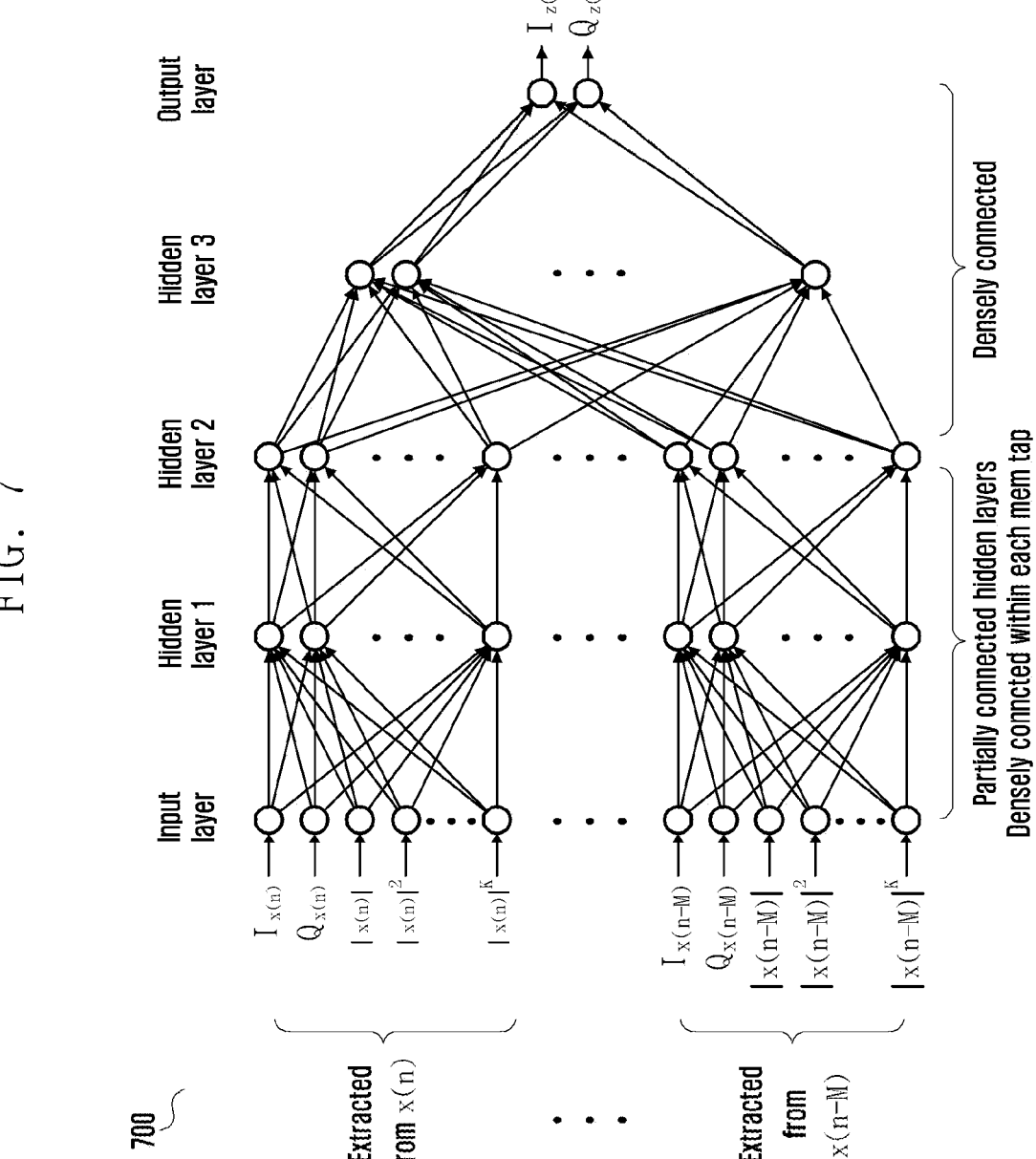
FIG. 7 is a diagram illustrating an example scenario of a method for compensating the power amplifier non-linearities using the NN architecture, according to various embodiments.

FIG. 7 is a diagram illustrating an example scenario of an example method for compensating the power amplifier non-linearities using the NN Architecture (700), according to various. The disclosed method provides both training and testing phases.

Learning the inverse function (DPD)—training phase: The x(n), y(n) input, output pairs are obtained from the PA (502). The real PAs also have some memory effects because of the usage of active elements such as capacitors. This leads to the current samples output being affected by past samples.

During the training phase, the network is passed normalized output $$\frac{y(n)}{G}$$

or current and past samples as inputs and the x(n) as output. This network then learn to minimize and/or reduce the loss between the actual input samples x(n) and the estimated input samples x^(n).

Implementation—testing phase: during the testing phase, the x(n) of current and previous samples are passed through the network with the previously trained weights and biases (from training phase) to obtain the digital predistorter output z(n), which is then passed through PA to obtain a linearly amplified version of x(n) as shows in FIG. 7.

In the disclosed architecture, in partially connected part of the network, the apparatus (500) have separate densely connected networks (the apparatus (500) refers to them as sub-networks) for each of the current and previous samples for compensating the nonlinear behaviour of the PA with respect to that sample alone. The fully connected part of the network handles the nonlinear memory effect, where the outputs of each of the sub-network are concatenated and are fed to another set of densely connected layers.

Having separate sub-networks for each sample (current and past), the apparatus (100) can decide the importance that needs to be given for each sample by tweaking the output nodes of those samples alone appropriately. The apparatus can also have a provision, where the apparatus need not train the sub-network part of the architecture for a different memory length requirements on the fly (online). The sub networks can be added/removed for the memory elements to be added/removed using the sub network parameters trained offline. This will help in reducing the training time on the device eventually.

The neural network based method to model the digital predistorter, which is trained to minimize/reduce the error between estimated and actual PA inputs using current and previous PA outputs, employing separate sub-network for each of the memory sample with their number of output nodes designed based on the chronology, and later the fully connected part of the network handles for the nonlinear caused by the memory and other external effects. Using this we can have the sub-networks trained offline to be fixed and train only the later part of the network online.

Also, for the same PA make, even though the general characteristics remain similar there could be subtle variations. Here, we can have a large dataset collected from the PAs of a same make and train the network offline and online, we can train only the fully connected part of the network to address the subtle variation for each PA along with other non-linearity causing factors online.

Figure 8:
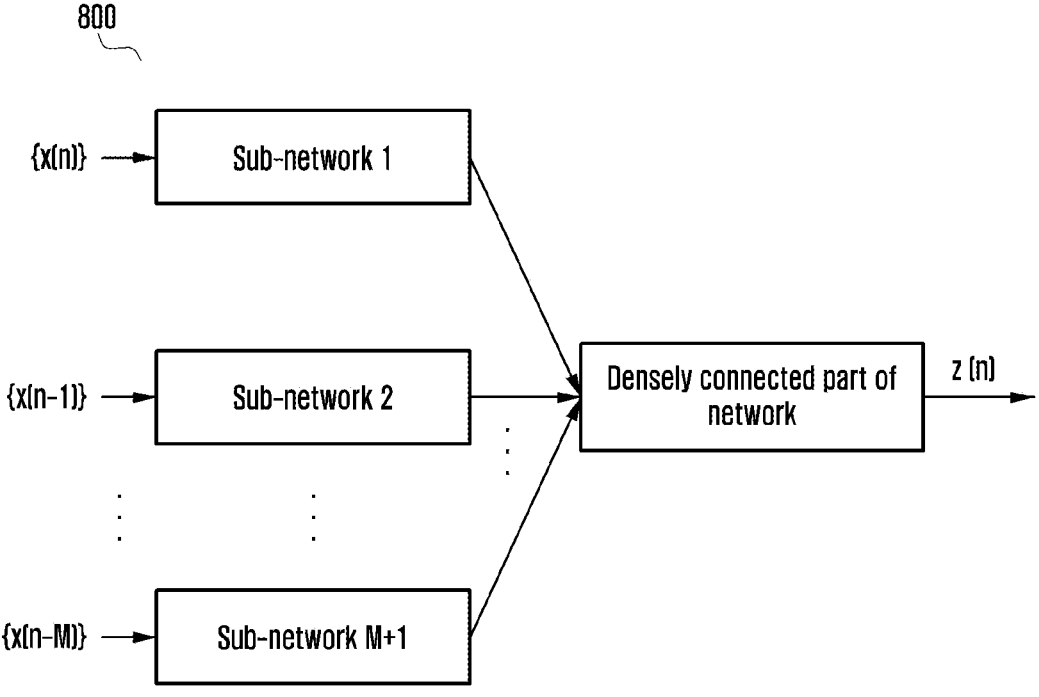
FIG. 8 is diagram illustrating an example scenario of a method for compensating the power amplifier non-linearities using Sub-network's complexity based on chronology, according to various embodiments.

FIG. 8 is a diagram illustrating an example scenario (800) of an example method for compensating the power amplifier non-linearities using Sub-network's complexity based on chronology, according to various embodiments. The number of output nodes of the sub-network corresponding to recent sample to past samples are scaled down gradually. The network's parameters are trained independently.

Figure 9:
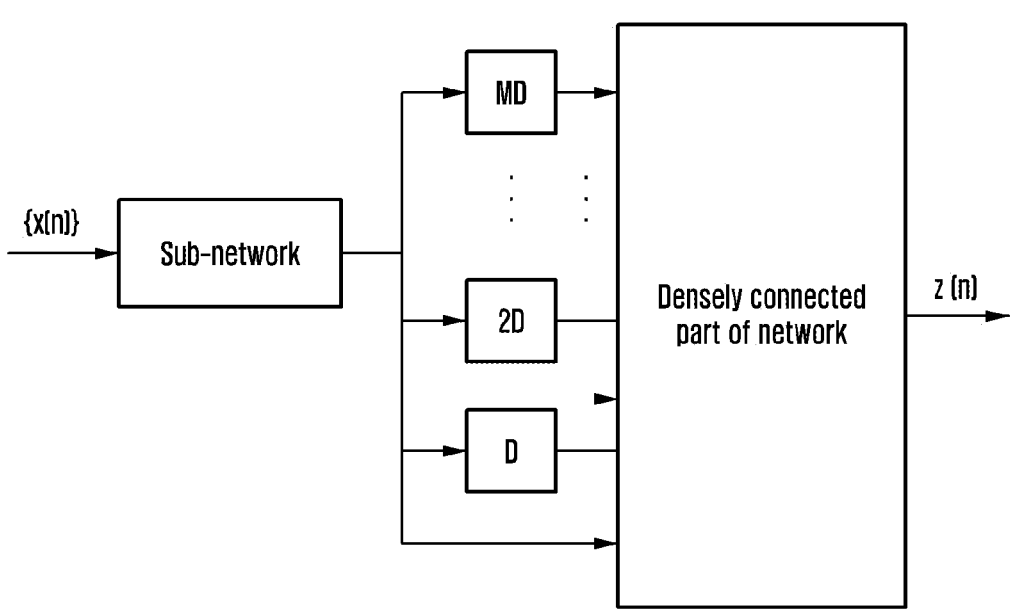
FIG. 9 is a diagram illustrating an example scenario of a method for compensating the power amplifier non-linearities using different memory length on the fly, according to various embodiments.

FIG. 9 is a diagram illustrating an example scenario (900) of an example method for compensating the power amplifier non-linearities using different memory length on the fly, according to the embodiments as disclosed herein. The apparatus trains the network in such a way that the same sub-network parameters (e.g., output nodes, weights and biases) are used for all the samples. Accordingly, when the operator of the apparatus (500) decides to change the memory length on the fly, we need to train the fully connected part of the network alone, which captures the other non-linear aspects such as memory, temperature, etc. Here, addition of more past samples (increasing memory length) needs addition of more sub-networks at the partially connected part of the network using the already known sub-network parameters.

Figure 10:
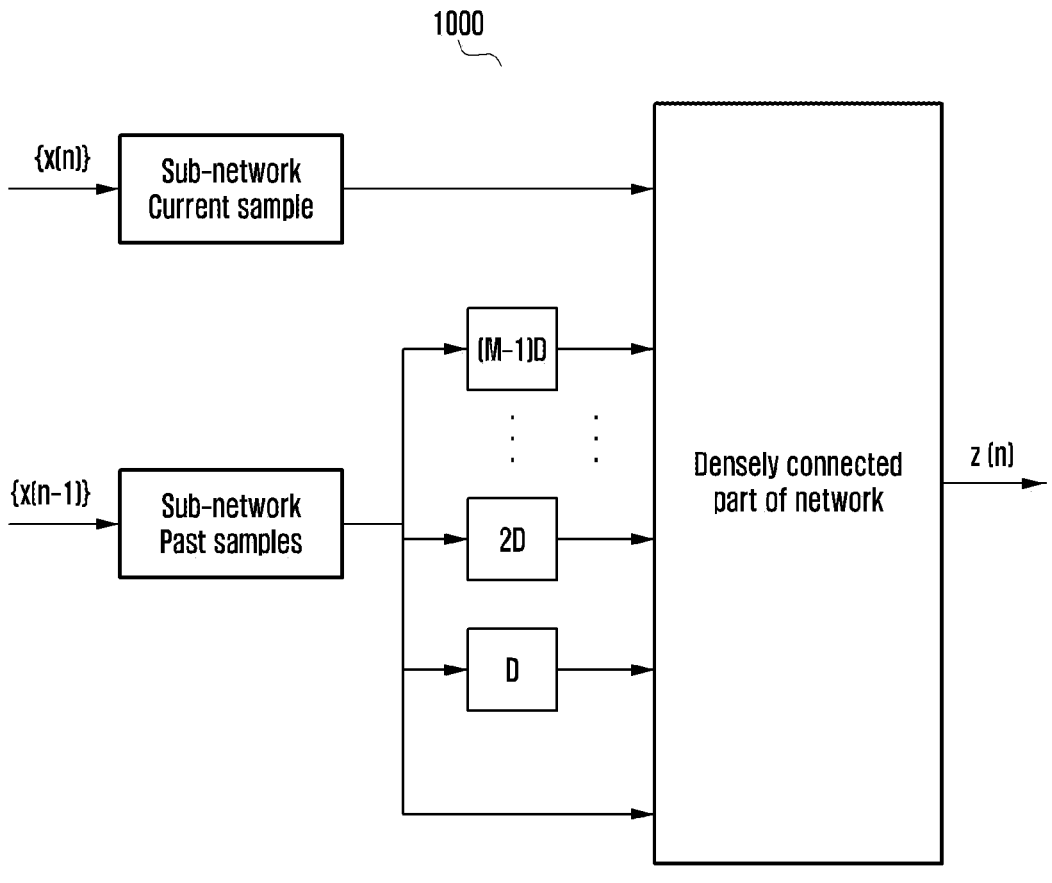
FIG. 10 is a diagram illustrating an example scenario of a method for compensating the power amplifier non-linearities using sub-network's complexity based on chronology, according to various embodiments.

FIG. 10 is a diagram illustrating an example scenario (1000) of an example method for compensating the power amplifier non-linearities using Sub-network's complexity based on chronology, according to various embodiments.

FIG. 10 illustrates a greater number of output nodes for the sub-network corresponding to the current sample. All the sub-networks corresponding to the past samples are trained with the same sub-network parameters (output nodes, weights and biases). This way, we can provide more significance to the recent sample and at the same time reduce the training time for changing memory lengths to used in future.

FIGS. 11A, 11B, 11C, 11D, 11E, 11F, 12 and 13 are diagrams and flowcharts (S1100 to S1300) illustrating various example methods for controlling the non-linear effect of the power amplifier (500), according to various embodiments.

Figure 11A:
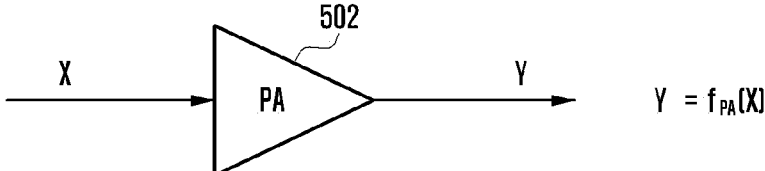

As shown in FIG. 11A, step 1, the apparatus (500) obtains the data from the power amplifier (502) in the form of (input, output)/(X,Y) pairs.

Figure 11B:
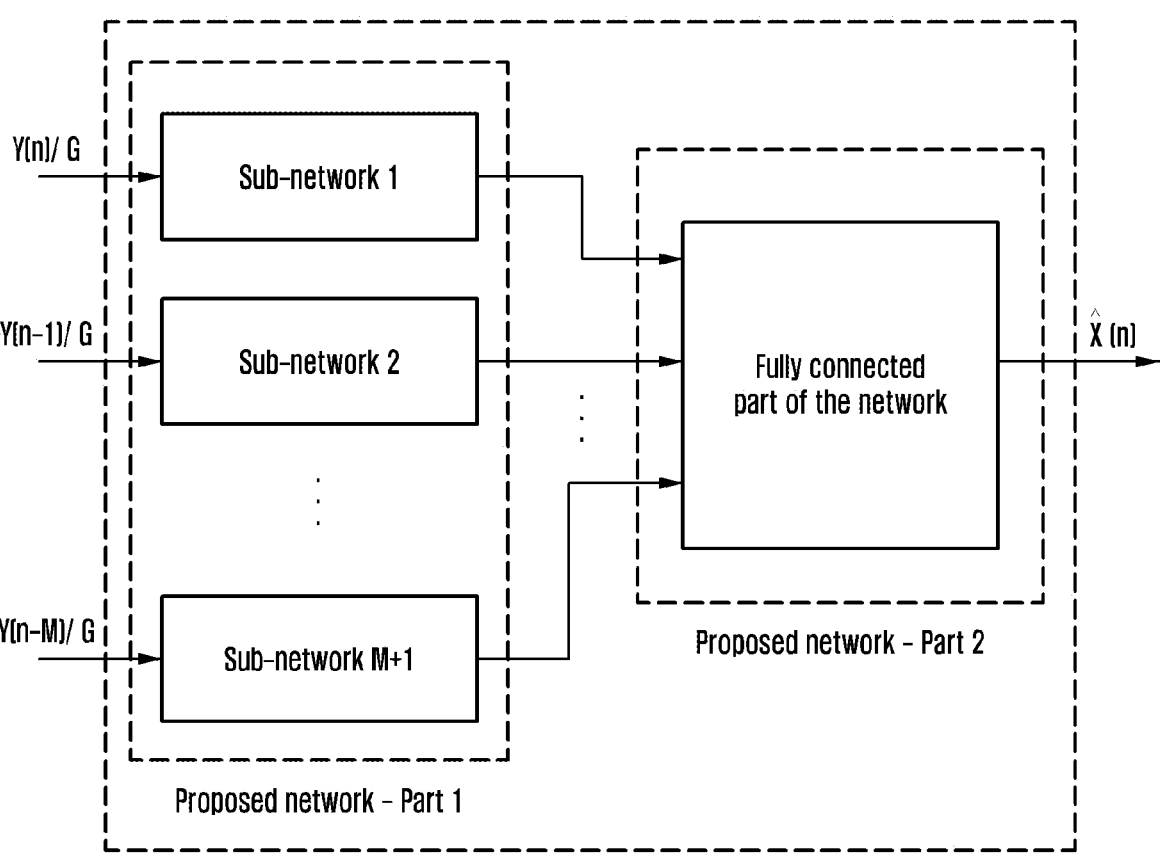

As shown in FIG. 11B, step 2, the apparatus (500) trains the network using current sample and "M" previous samples and their non-linear polynomials as mentioned in variation (as shown in FIG. 10) by fixing all the past samples parameters (nodes, weights and biases). The network parameters are trained to minimize/reduce the MSE between X and X̂.

Figure 11C:
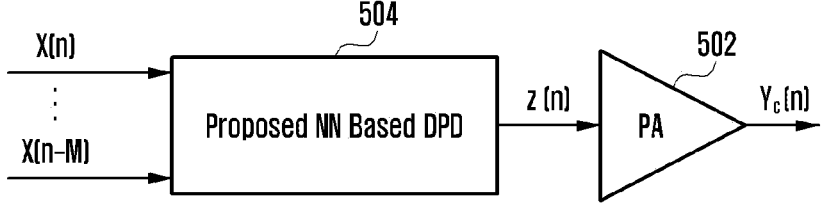

As shown in FIG. 11C, step 3, the apparatus (500) uses the trained network before the PA (502) to reduce the non-linear effect and transmit the linearly amplified signal.

Figure 11D:
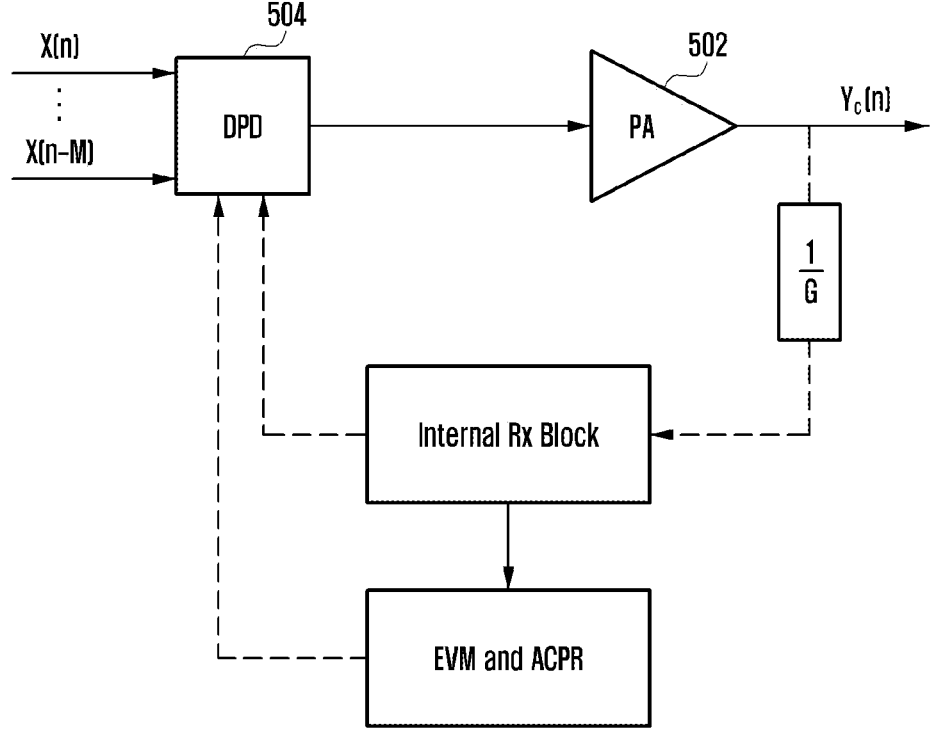

As shown in FIG. 11D, step 4, the metrics such as EVM and ACPR are continuously monitored.

Figure 11E:
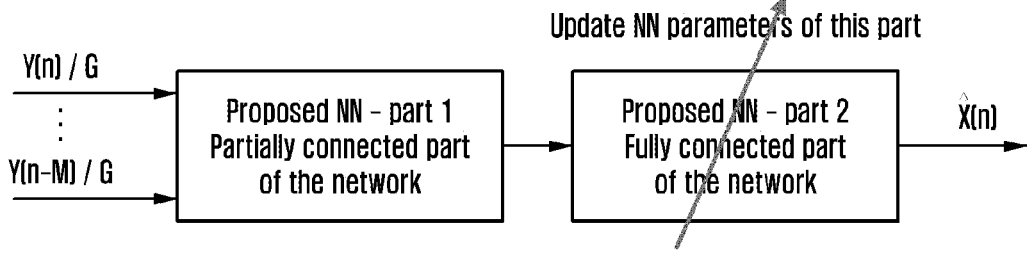

As shown in FIG. 11E, step 5, if the EVM and ACPR are below a predefined (e.g., specified) threshold, retrain the network online (on the fly), where the apparatus (500) adds/removes the sub-networks based on the effect of past samples memory. Here, the apparatus (500) uses the same fixed parameters we obtained from offline training for the sub-networks (partially connected part of the network) and train only the fully connected part of the network.

Figure 11F:
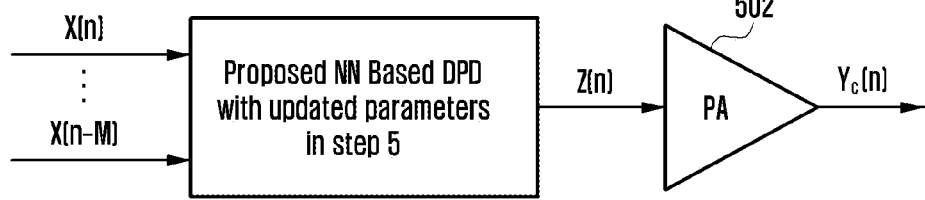

As shown in FIG. 11F, step 6, the apparatus (500) replaces the fully connected part of the neural network's parameters (weights and biases) used and step 3 using the parameters obtained in step 5 and repeat from step 3.

As shown in FIG. 12, at S1202, the method S1200 includes training, by the apparatus (500), the NN based DPD (504) of the apparatus, wherein the NN based DPD (504) comprises at least one sub-network from the plurality of sub-networks. At S1204, the method includes placing, by the apparatus (500), the trained NN based DPD (504) before the power amplifier (502) to control the non-linear effect of the output data of the power amplifier (502).

Figure 14:
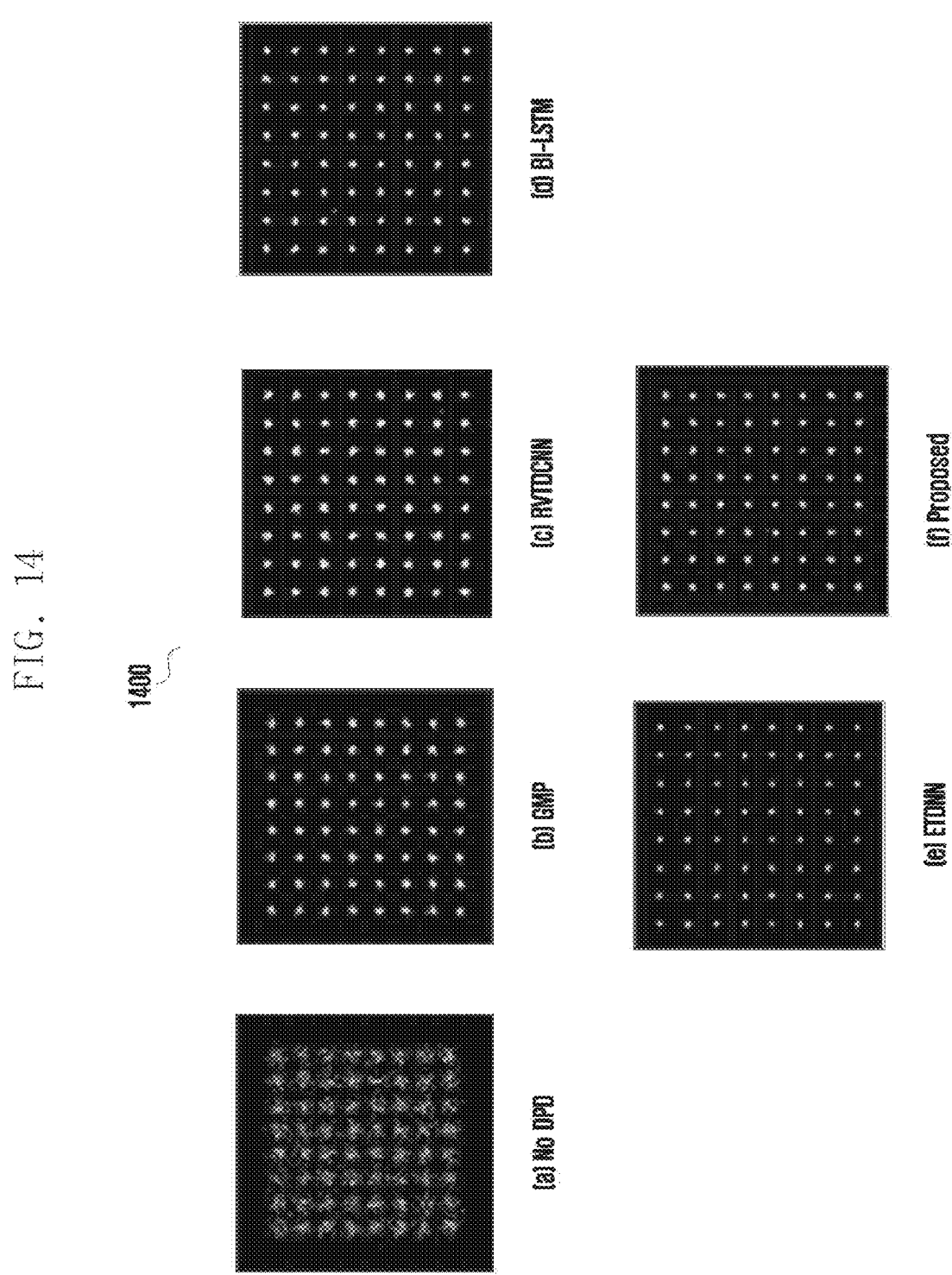
FIG. 14 is a diagram illustrating a performance comparison using a constellation diagram, according to various embodiments.

As shown in FIG. 13, at S1302, the method S1300 includes acquiring the input data of the power amplifier (502) and the output data of the power amplifier (502). At S1304, the method includes determining the inverse function using the neural network, wherein the inverse function maps normalized output data of the PA to the input data of the PA. The neural network comprises at least one sub-network for at least one memory tap from the plurality of memory taps in the neural network. At S1306, the method includes modifying the input data based on the determined inverse function value by dynamically changing a usage of the at least one memory tap from the plurality of memory taps. At S1308, the method includes compensating the non-linear effect in the output data of the power amplifier FIG. 14 is a diagram illustrating example performance comparison using constellation diagram (1400), according to various embodiments. FIG. 14 illustrates the output constellation for various DPDs for 64QAM data.

The various actions, acts, blocks, steps, or the like in the flow charts (S1100-S1300) may be performed in the order presented, in a different order or simultaneously. Further, in various embodiments, some of the actions, acts, blocks, steps, or the like may be omitted, added, modified, skipped, or the like without departing from the scope of the disclosure.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure including the appended claims and their equivalents. It will also be understood that any of the embodiment(s) described herein may be used in conjunction with any other embodiment(s) described herein.

What is claimed is:

1. A method for controlling a non-linear effect of a power amplifier, the method comprising:

training, by an apparatus, a neural network (NN)-based Digital Pre-distorter (DPD) of the apparatus, wherein the NN-based DPD comprises at least one sub-network from a plurality of sub-networks;

controlling, by the apparatus, the non-linear effect of output data of the power amplifier using the trained NN-based DPD;

transmitting, by the apparatus, a linearly amplified signal comprising the non-linear effect of the output data of the power amplifier;

monitoring, by the apparatus, at least one of an error vector magnitude (EVM) parameter associated with the linearly amplified signal or an adjacent channel leakage ratio (ACLR) parameter associated with the linearly amplified signal;

determining, by the apparatus, whether at least one of the EVM parameter and the ACLR parameter satisfies a specified threshold; and when at least one of the EVM parameter and the ACLR parameter does not satisfy the specified threshold, retraining the trained NN-based DPD.

2. The method as claimed in claim 1, wherein the method further comprises:

determining, by the apparatus, whether at least one of the EVM parameter and the ACLR parameter satisfies the specified threshold; and performing, by the apparatus, at least one of:

retaining at least one NN parameter in the trained NN-based DPD when at least one of the EVM parameter and the ACLR parameter satisfies the specified threshold, and retraining the trained NN-based DPD to modify at least one NN parameter in the trained NN-based DPD when at least one of the EVM parameter and the ACLR parameter does not satisfy the specified threshold.

3. The method as claimed in claim 1, wherein a number of an output node of the sub-network corresponds to a current input data, to at least one previous input data and at least one previous output data.

4. The method as claimed in claim 1, wherein the NN-based DPD comprises:

training a fully connected part of the network, wherein the fully connected part captures a non-linear parameter, wherein the non-linear parameter comprises memory information and temperature information; and training a partially connected part of the plurality of sub-networks based on at least one previous input data and at least one previous output data, wherein the fully connected part and the partially connected part are trained separately, wherein the fully connected part is trained in real time, wherein the fully connected part of the network and the partially connected part of the plurality of sub-networks are trained together in an initial stage, and based on there being further non-linearities in the apparatus, the apparatus is configured to train only the fully connected part while retaining previous parameters for the partially connected part in the real time.

5. The method as claimed in claim 1, wherein the NN-based DPD is trained by all sub-networks corresponding to at least one previous input data and at least one previous output data with at least one sub-network parameter, wherein the at least one sub-network parameter comprises an output node, weight and biases.

6. A method for controlling a non-linear effect of a power amplifier, the method comprising:

acquiring, by an apparatus, an input data of the power amplifier (PA) of the apparatus and an output data of the power amplifier;

determining, by the apparatus, an inverse function using a neural network, wherein the inverse function maps normalized output data of the PA to the input data of the PA, wherein the neural network comprises at least one sub-network for each of at least one memory tap from a plurality of memory taps in the neural network;

modifying, by the apparatus, the input data based on the determined inverse function by dynamically changing a usage of the at least one memory tap from the plurality of memory taps; and compensating, by the apparatus, the non-linear effect in the output data of the power amplifier.

7. The method as claimed in claim 6, wherein the inverse function is learned by reducing an error between a current input of the power amplifier and an estimated input of the power amplifier from a normalized power amplifier output over a period of time.

8. An apparatus configured to control a non-linear effect of a power amplifier, the apparatus comprising:

a neural network (NN)-based Digital Pre-distorter (DPD), wherein the NN-based DPD comprises at least one sub-network from a plurality of sub-networks; and a trained NN-based DPD disposed before the power amplifier and configured to control the non-linear effect of output data of the power amplifier, wherein the power amplifier is configured to transmit a linearly amplified signal comprising the non-linear effect of the output data of the power amplifier, and wherein the NN-based DPD is configured to:

monitor at least one of an error vector magnitude (EVM) parameter associated with the linearly amplified signal and an adjacent channel leakage ratio (ACLR) parameter associated with the linearly amplified signal, determine whether at least one of the EVM parameter and the ACLR parameter satisfies a specified threshold, and when at least one of the EVM parameter and the ACLR parameter does not satisfy the specified threshold, retrain the trained NN-based DPD.

9. The apparatus as claimed in claim 8, wherein the trained NN-based DPD is configured to:

determine whether at least one of the EVM parameter and the ACLR parameter satisfies the specified threshold; and perform at least one of:

retaining at least one NN parameter in the trained NN-based DPD when at least one of the EVM parameter and the ACLR parameter satisfies the specified threshold, and retraining the trained NN-based DPD to modify at least one NN parameter in the trained NN-based DPD when at least one of the EVM parameter and the ACLR parameter does not satisfy the specified threshold.

10. The apparatus as claimed in claim 8, wherein a number of an output node of the sub-network corresponds to a current input data, to at least one previous input data and at least one previous output data, wherein the number of output nodes corresponding to the sub-networks for current and past samples are different.

11. The apparatus as claimed in claim 8, wherein the NN-based DPD is configured to be trained by:

training a fully connected part of the network, wherein the fully connected part captures a non-linear parameter, wherein the non-linear parameter comprises a memory information and temperature information; and training a partially connected part of the plurality of sub-networks based on at least one previous input data and at least one previous output data, wherein the fully connected part and the partially connected part are trained separately, wherein the fully connected part is trained in real time, wherein the fully connected part of the network and the partially connected part of the plurality of sub-networks are trained together in an initial stage, and based on there being further non linearities in the apparatus, the apparatus is configured to train only the fully connected part while retaining previous parameters for the partially connected part in the real time.

12. The apparatus as claimed in claim 8, wherein the NN-based DPD is configured to be trained by all sub-networks corresponding to at least one previous input data and at least one previous output data with at least one sub-network parameter, wherein the at least one sub-network parameter comprises an output node, weight and biases.

13. An apparatus configured to control a non-linear effect of a power amplifier, the apparatus comprising:

a neural network (NN)-based Digital Pre-distorter (DPD), wherein the NN-based DPD comprises at least one sub-network from a plurality of sub-networks, wherein the NN-based DPD is configured to:

acquire an input data of the power amplifier (PA) of the apparatus and an output data of the power amplifier;

determine an inverse function, wherein the inverse function is configured to map normalized output data of the PA to the input data of the PA wherein the NN-based DPD comprises at least one sub-network for each of at least one memory tap from a plurality of memory taps in the neural network;

modifying the input data based on the determined inverse function by dynamically changing a usage of the at least one memory tap from the plurality of memory taps; and compensating for the non-linear effect in the output data of the power amplifier.

14. The apparatus as claimed in claim 13, wherein the inverse function is learned by reducing an error between a current input of the power amplifier and an estimated input of the power amplifier from a normalized power amplifier output over a period of time.

\* \* \* \* \*